(12) United States Patent
Chen et al.

(10) Patent No.: US 8,044,553 B2
(45) Date of Patent: Oct. 25, 2011

(54) TEMPERATURE COMPENSATED SURFACE ACOUSTIC WAVE DEVICE AND METHOD HAVING BURIED INTERDIGITAL TRANSDUCERS FOR PROVIDING AN IMPROVED INSERTION LOSS AND QUALITY FACTOR

(75) Inventors: Alan S. Chen, Windermere, FL (US); Taeho Kook, Orlando, FL (US); Kurt G. Steiner, Orlando, FL (US); Stephen A. Neston, Orlando, FL (US); Timothy J. Daniel, Orlando, FL (US)

(73) Assignee: Triquint Semiconductor, Inc., Orlando, FL (US)

( * ) Notice: Subject to any disclaimer, the term of this patent is extended or adjusted under 35 U.S.C. 154(b) by 81 days.

(21) Appl. No.: 12/709,772

(22) Filed: Feb. 22, 2010

(65) Prior Publication Data
US 2011/0204747 A1   Aug. 25, 2011

(51) Int. Cl.
*H03H 9/25* (2006.01)
*H01L 41/22* (2006.01)

(52) U.S. Cl. .................... 310/313 R; 310/340; 29/25.35

(58) Field of Classification Search ... 310/313 A–313 D, 310/313 R, 340; 29/25.35
See application file for complete search history.

(56) References Cited

U.S. PATENT DOCUMENTS

| | | | |
|---|---|---|---|
| 6,864,424 B2 * | 3/2005 | Mishima et al. | 174/549 |
| 7,209,018 B2 | 4/2007 | Nakao et al. | |
| 7,224,101 B2 | 5/2007 | Mishima et al. | |
| 7,230,365 B2 | 6/2007 | Nishiyama et al. | |
| 2006/0273687 A1 * | 12/2006 | Fujimoto et al. | 310/313 R |
| 2008/0182367 A1 | 7/2008 | Petti | |
| 2009/0265904 A1 | 10/2009 | Kando et al. | |
| 2009/0280584 A1 | 11/2009 | Parekh | |
| 2010/0033055 A1 * | 2/2010 | Nakatani | 310/313 R |

FOREIGN PATENT DOCUMENTS

| | | |
|---|---|---|
| JP | 200580202 | 3/2005 |
| JP | 2005150915 | 6/2005 |
| WO | 2004070946 | 8/2004 |
| WO | 2006114930 | 11/2006 |
| WO | 2008087836 | 7/2008 |

* cited by examiner

*Primary Examiner* — Thomas M Dougherty
(74) *Attorney, Agent, or Firm* — Allen, Dyer, Doppelt, Milbrath & Gilchrist, P.A.

(57) ABSTRACT

A SAW device having metal electrodes on a surface of the piezoelectric substrate includes a dielectric layer deposited on the surface. Depositing the layer results in seams extending upward from the electrodes extending above the surface of the substrate. An additional seam results from one seam extending from one electrode joining a second seam extending from an adjacent electrode within the dielectric layer and is generally formed above the height of the electrodes. The additional seam is removed through planarization or the like. The dielectric layer may be further planarized for providing a thickness of the dielectric layer above the electrodes as desired.

23 Claims, 6 Drawing Sheets

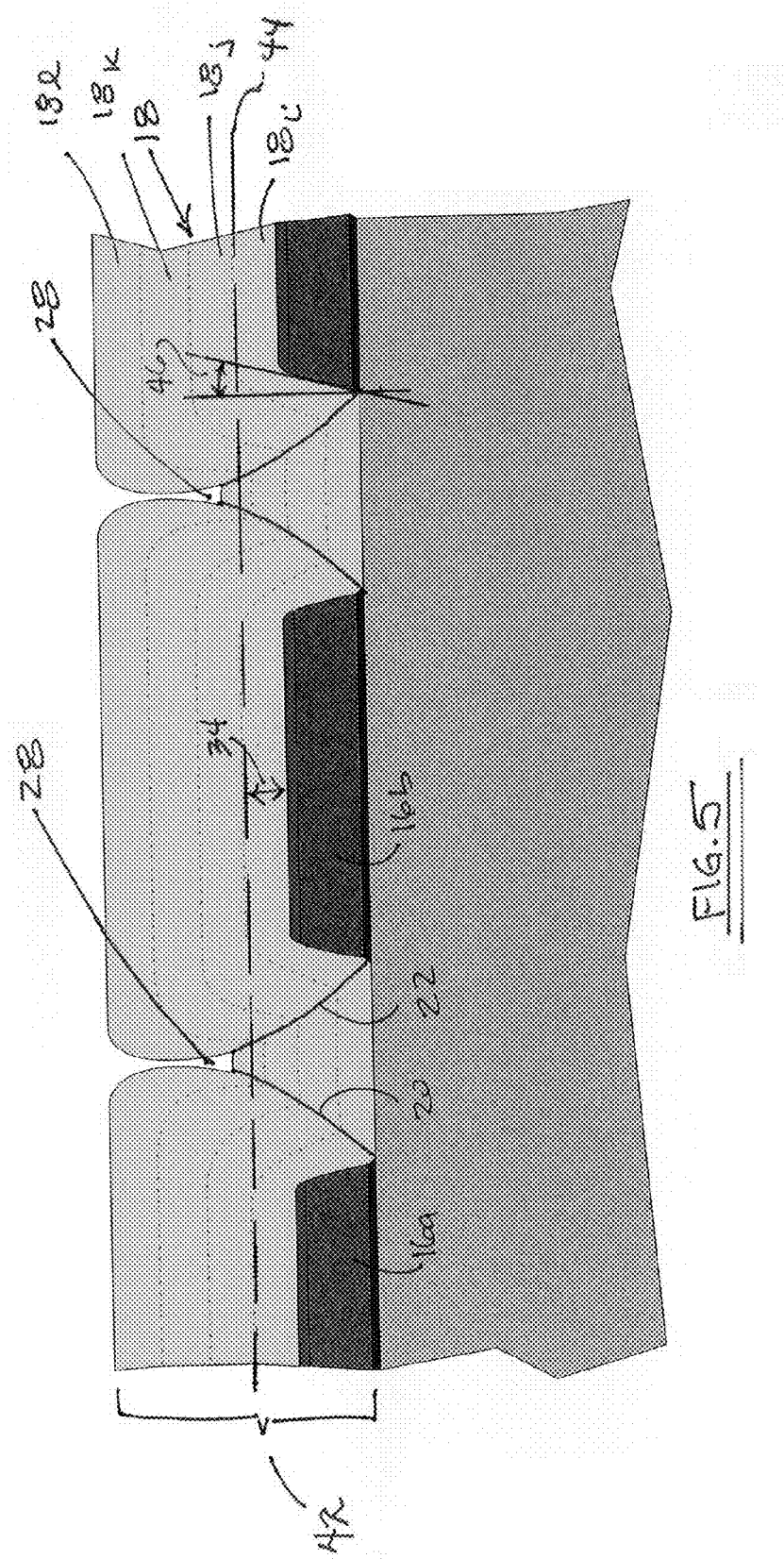

TEMPERATURE COMPENSATED SURFACE ACOUSTIC WAVE DEVICE AND METHOD HAVING BURIED INTERDIGITAL TRANSDUCERS FOR PROVIDING AN IMPROVED INSERTION LOSS AND QUALITY FACTOR

FIELD OF INVENTION

The present invention generally relates to Surface Acoustic Wave (SAW) devices, and more particularly to SAW filters in which the interdigital transducer (IDT) or resonator is buried beneath a dielectric layer, such as an oxide layer.

BACKGROUND OF THE INVENTION

SAW devices have been widely used for filtering applications in many telecommunication systems. The SAW filter is generally composed of several resonators. Further, there are several SAW resonator configurations that are well known in the art. One configuration for a SAW resonator comprises an interdigital transducer (IDT) embedded between the two reflectors. The SAW resonator is typically fabricated on a high coupling piezoelectric substrate such as Lithium Tantalate (LT) or Lithium Niobate (LN), by way of example. The IDT generally comprises interdigitated metal electrodes connected to opposing busbars. When a radio frequency (RF) field is applied to the opposing electrodes, the piezoelectric material will convert electrical energy to mechanical energy in the form of acoustic waves. These acoustic waves are reflected by the outer reflectors thereby forming a standing wave resonator. A plurality of resonators is typically arranged in series and parallel arms to realize a ladder filter network. Another configuration of a SAW filter comprises a coupled resonator in which multiple interdigital transducers are embedded between the reflectors.

It is well known in the art that the use of oxide layers or coatings, such as a silicon dioxide (SiO2) layer formed above the transducer provides an improvement in the temperature characteristics of the SAW filter performance as the linear coefficient of expansion of the silicon dioxide layer is opposite the acoustic temperature coefficient for that of LT or LN piezoelectric substrates. By way of example, U.S. Pat. No. 7,209,018 to Nakao et al. discloses a SAW filter in which the SiO2 layer that covers the electrodes has convex and concave portions. The electrode metal thickness is in the range of 1%-2.5% of the wavelength for improved insertion loss and temperature characteristics.

Further, U.S. Pat. No. 7,230,365 to Nishiyama et al. discloses that the lack of planarization actually degrades the insertion loss of the SAW resonator. It is well known in the art that once an oxide layer is put onto the SAW transducer pattern, a planarization process should help to improve loss degradation. To improve the filter performance, Nishiyama teaches the use of two SiO2 layers. The first layer of SiO2 is disposed between the metal electrodes on the piezoelectric substrate, the thickness of the layer substantially equal to the thickness of the metal electrodes. The second layer of SiO2 provides a cover to the first oxide layer and the metal electrodes. Nishiyama emphasizes that the devices require the first SiO2 layer to be of the same thickness of that of the electrode metal to provide improved insertion loss.

In addition, the quality factor of the SAW resonators under a silicon dioxide layer is greatly affected by the integrity of the oxide material and by the flatness of the top surface of the oxide layer. The coupling coefficient and the temperature coefficient of frequency (TCF) of the buried SAW resonator is determined by the oxide layer thickness over the resonator. It is observed that the double layers of SiO2 as described by Nishiyama consistently result in "voids" in the vicinity of the electrode edges. These voids, by way of example, are portions or traces of SiO2 that exhibit lower density when compared to the overall layer. Based on the teachings of the present invention, voids or seams within the oxide layer can significantly degrade the quality factor of the resonator. The present invention provides devices and methods for the deposition of oxide layers resulting in a produced device having a significant void reduction, thus providing an improved insertion loss and quality factor of the resonator.

SUMMARY OF THE INVENTION

In view of the foregoing background, the present invention improves the performance and yield of temperature-compensated surface acoustic devices formed with SiOx surrounding inter-digitated transducers (SiOx-buried IDT), where "x" is a real and positive number.

By way of example, the Quality Factor of an SiOx-buried resonator at anti-resonance is greatly affected by the integrity of the SiOx material, such as the presence of voids or seams in the SiOx material, and the planarity of SiOx over the resonator. Further, the Coupling Coefficient and TCF of a silicon oxide buried resonator, such as SiOx, is determined by the thickness of the SiOx layer over the resonator.

One embodiment of the present invention may comprise a deposition of planarizing SiOx which is thicker than the IDT metal thickness, a first etchback planarization of SiOx with photoresist, a second etchback planarization of SiOx with photoresist, leaving SiOx over the IDTs. A measurement of residual planarizing SiOx is made and a deposition of an overcoat of SiOx material to a thickness suitable for the target resonator resonance and anti-resonance performance is then made. While planarization, including methods such as photoresist and etchback, is herein described by way of example, it will be understood by those of ordinary skilled in the art that alternate means such as chemical mechanical polishing (CMP) may equivalently be employed without departing from the teachings of the preset invention.

The present invention greatly improves the planarity and quality of the SiOx layers. By way of example, with a double etchback planarization, a flatness of the oxide layer may be desirably maintained at less than 500 A with typical values around 300 A. With a single planarization, greater than 500 A of flatness is observed. Without planarization, it is significant higher.

Performance of surface acoustic wave filters formed with SiOx surrounding inter-digitated transducers is marginal when theses reduced density pockets, herein referred to as voids or seams, are present in the SiOx and the planarity of overcoat SiOx is poor. Double-etchback with a single planarizing SiOx layer followed by an overcoat SiOx eliminates or significantly reduces such voids in SiOx, and greatly improves the planarity and quality of overcoat SiOx over a resonator. This improves both the quality factor and coupling coefficient of the resonator. With a double etchback planarization, the first SiOx layer is much thicker than the electrode thickness. This is one feature that distinguishes embodiments of the invention from well known devices and methods.

By way of example, the embodiments and methods herein presented by way of example for the present invention may be applied in the manufacture of TX and RX filters. The current invention may use a planarizing SiOx layer coupled with a double etchback planarization process to eliminate or reduce voids in the SiOx, with a desirable result, and greatly improved compared to known methods.

One method aspect of the present invention may comprise fabricating a SAW device. The method may comprise the steps of placing a plurality of metal electrodes onto a surface of a piezoelectric substrate and depositing a dielectric layer onto the surface of the piezoelectric substrate to a thickness greater than a thickness of the metal electrodes. The depositing step forms seams extending upward from the electrodes extending above the surface of the substrate. One seam may extend from one electrode and join a second seam extending from an adjacent electrode to form a third seam or void within the dielectric layer, the void located generally higher than a top surface of the electrodes. The dielectric layer is then planarized to a distance above the electrodes sufficient to remove the void from within the dielectric layer.

Another method aspect of the present invention may comprise providing a piezoelectric substrate, placing a plurality of metal electrodes onto a surface of the piezoelectric substrate, depositing a dielectric layer onto the surface of the piezoelectric substrate sufficient to cover the electrodes, wherein the depositing forms seams extending upward from the electrodes, and wherein one seam extending from one electrode joins a second seam extending from an adjacent electrode to form a third seam within the dielectric layer and generally above the electrodes, and substantially removing the third seam from the dielectric layer.

The substantial removal of the third seam may comprise removal resulting from at least one of a planarization to the dielectric layer to a distance above the electrodes sufficient to partially remove the third seam, a planarization to the dielectric layer to a distance above the electrodes sufficient to fully remove the third seam, filling the third seam with at least one of a dielectric material forming the dielectric layer and a second dielectric material, and a combination thereof.

The seam forming comprises formation of a region within the dielectric layer having a density generally less than a density extending substantially throughout the dielectric layer. The third seam comprises an amount of dielectric ranging from no dielectric to a dielectric having a density less than the density of dielectric in the first and second seams.

Alternatively, a second layer may be deposited. The dielectric layer may comprise a first dielectric layer and a second layer, wherein a depositing step may comprise depositing a second dielectric layer onto the planarized dielectric layer. Yet further, additional steps may comprise planarizing the second dielectric layer for providing at least one of a flatness to a surface thereof and a resulting thickness of an overcoat formed by the first and second dielectric layers above the electrodes at least greater than the thickness of the electrodes. For embodiments herein described by way of example, the dielectric layers may include oxide layers. In addition, the dielectric layer being deposited may be at least greater than the electrode thickness. The present invention permits providing layers of any preselected and desired thickness. By way of example, for a CMP process, the thickness may be preselected to be at least 1.5 times the electrode thickness to clearly avoid hitting the electrodes during the chemical mechanical polishing.

One embodiment of the invention may comprise a SAW device and described as including a piezoelectric substrate having a surface thereon and a plurality of metal electrodes on the surface of the piezoelectric substrate. A dielectric layer is carried on the surface of the piezoelectric substrate resulting from depositing the dielectric layer to a thickness greater than a thickness of the metal electrodes, wherein the depositing forms seams extending upward from the electrodes. A third seam results from one seam extending from one electrode joining a second seam extending from an adjacent electrode within the dielectric layer and generally above the electrodes. The third seam is removed or significantly reduced by applying a planarization to the dielectric layer to a distance above the electrodes sufficient to remove or significantly reduce the third seam from the dielectric layer. The dielectric layer may be planarized for providing at least one of a flatness to a surface thereof and a resulting thickness of an overcoat formed by the first and second dielectric layers above the electrodes at least greater than the thickness of the electrodes. The dielectric layer may comprise an oxide layer or layers.

BRIEF DESCRIPTION OF THE DRAWINGS

Other features and advantages of the present invention will become more apparent from the following detailed description of embodiments herein disclosed by way of example with reference to the attached drawings, in which.

DETAILED DESCRIPTION OF EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
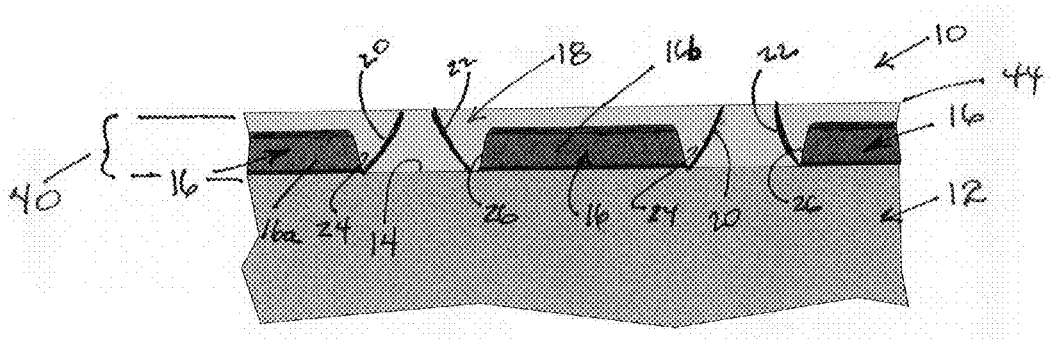
FIG. 1 is a partial diagrammatical illustration of an acoustic wave device in keeping with the teachings of the present invention.

With reference initially to FIG. 1, one embodiment of the present invention is herein described, by way of example as an acoustic wave device 10 comprising a piezoelectric substrate 12 having a surface 14 thereon, and a plurality of metal electrodes 16 on the surface of the piezoelectric substrate. A dielectric layer 18 is on the surface 14 of the piezoelectric substrate 12 and buries the electrodes 16 within the dielectric layer. As herein described with continued reference to FIG. 1, the device 10 is herein diagrammatically illustrated as having first and second seams 20, 22 extending upwardly from opposing first and second edges 24, 26 of adjacent electrodes 16a, 16b. As will be further described in greater detail, such seams 20, 22 are formed during the application of the dielectric layer 18, and are typically areas within the dielectric layer have a lower density than the generally formed within the overall layer.

Figure 2:
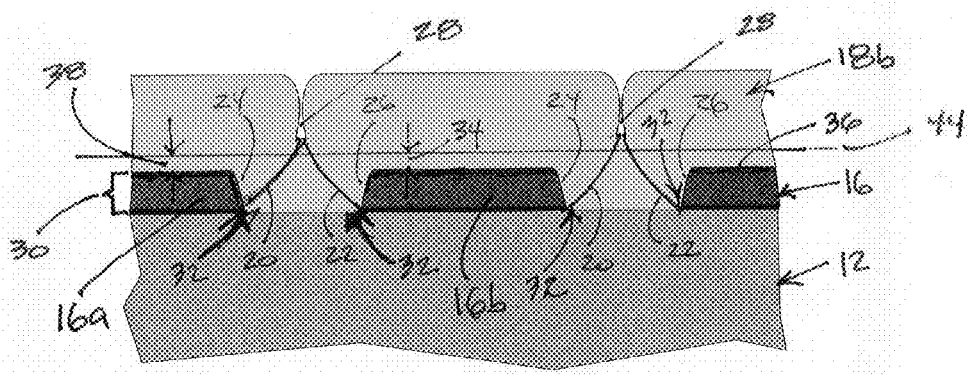
FIG. 2 is a diagrammatical illustration of a buried interdigital acoustic wave device in a preliminary stage of fabrication and prior to removal of undesirable voids from a dielectric layer covering electrodes.

With continued reference to FIG. 1 and now with reference to FIG. 2, both the seams 20, 22 and voids 28 result from depositing the dielectric layer 18b to a thickness greater than a thickness 30 of the electrodes 16. The depositing of the dielectric layer 18b forms the seams 20, 22 extending upward from the electrodes 16 resulting from discontinuities 32 on the surface 14 of the piezoelectric substrate 12 formed by the electrodes 16 extending above the surface of the substrate. The void 28 may be described as a third seam (an open or a closed cavity depending upon the spacing between electrodes) formed from the joining of the first and second seams 20, 22. However, as will further be addressed later in this section, this void 28, or third seam has an undesirably low density to an absence of dielectric material. According to the teachings of the present invention, and with continued reference to FIG. 2, the dielectric layer 18b is planarized, or the like, to a depth into the dielectric layer sufficient to remove the void 28, thus resulting in the embodiment illustrated with reference again to FIG. 1. By way of example, one embodiment as herein illustrated includes applying a planarization to the dielectric layer 18b of FIG. 2 to a location 44 above a top surface 36 of the electrodes 16 sufficient to remove the third seam/void 28 from within the remaining dielectric layer.

One embodiment includes the dielectric layer 18b of FIG. 2 being planarized sufficiently for providing the dielectric layer 18 with a thickness 40 of the dielectric layer 18 above the electrodes 16, as illustrated with reference again to FIG. 1. For the embodiments herein described and tested, the dielectric layer 18 comprises an oxide layer. As illustrated with reference to FIG. 3, the dielectric layer 18 may form an overcoat comprising a first dielectric layer 18a and a second layer 18c that is deposited after the planarizing of layer 18b described earlier with reference to FIG. 2. The planarizing of the second dielectric layer 18c may be completed for providing a desired flatness and/or desired thickness of the completed layer 18, formed by the first and second dielectric layers 18a, 18c, for which the layer 18a has already been planarized as may be desired. It will come to the minds of those skilled in the art, now having the benefit of the teachings of the present invention, that once an acceptable seam and unacceptable void is established, layers may be planarized as desired with or without an addition of additional layers to form an overcoat for the buried IDT.

Figure 3:
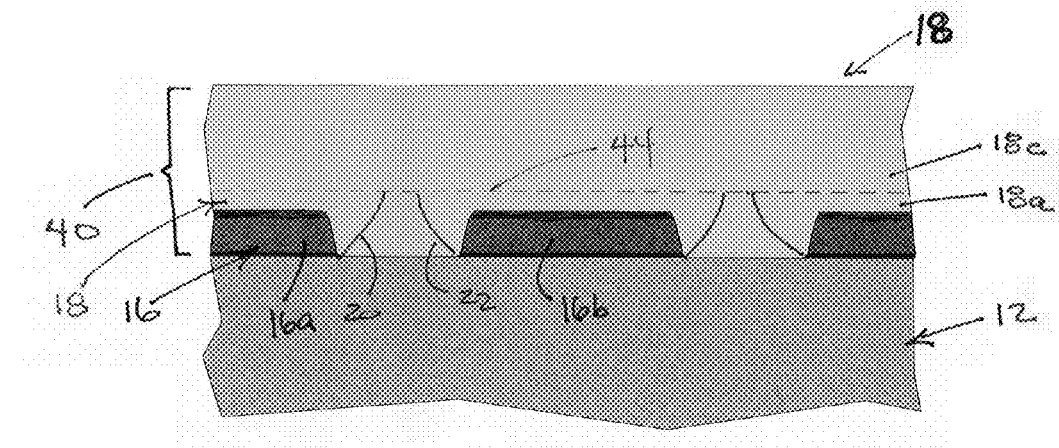
FIG. 3 is a diagrammatical illustration of a buried interdigital acoustic wave device including acceptable seams while having undesirable voids removed after planarization of the dielectric layer, and wherein a second layer is added onto the planarized layer.
Figure 4:
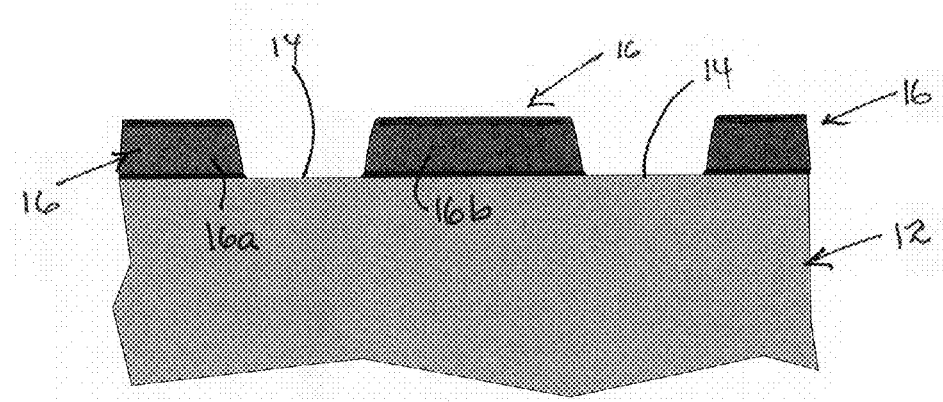
FIG. 4 is a diagrammatical illustration of an acoustic wave device readied for addition of a dielectric layer.

One method aspect of the invention is herein described with reference now to FIGS. 4 and 5, wherein fabricating the SAW device 10 earlier described comprises providing the piezoelectric substrate 12 and placing a plurality of the metal electrodes 16 onto the surface 14 of the piezoelectric substrate. The dielectric layer 18 earlier descried with reference to FIGS. 1 and 3, is the deposited onto the surface 14 of the piezoelectric substrate 14 and over the electrodes 16 to a thickness 42 at least greater than the thickness 30 of the metal electrodes 16. In this method of applying the dielectric layer 18, the seams 20, 22 are formed and extend upward from the electrodes 16 resulting from the discontinuity 32, wherein one seam 20 extends from one electrode 16a and joins the second seam 22 extending from the adjacent electrode 16b to form the third seam or void 28 within the dielectric layer 18. The void 28 formed higher than the surface 34 of the electrodes 16, can thus be eliminated by planarization or a combination of planarization and deposition of a second dielectric deposition. For one embodiment herein described, by way of example, the dielectric layer 18 is planarized (line 44) to a preselected distance 34 above the electrodes 16 sufficient to remove the void 28 from the remaining dielectric layer. By way of further explanation, one fabrication sequence may comprise the embodiment illustrated with reference to FIG. 3, resulting from steps illustrated with reference to the structures of FIGS. 4, 2 and 1, in that order.

Again, the seams 20, 22 may be described as regions within the dielectric layer 18 having their density generally less than the density extending throughout the dielectric layer, yet acceptable with regard to affecting performance of the device 10. However, the void 28 or third seam formed by the merging of the first and second seams 20, 22 comprises an undesirable amount of dielectric ranging from the void having no dielectric to a dielectric material having a density generally less than the density of the surrounding dielectric.

Figure 6:
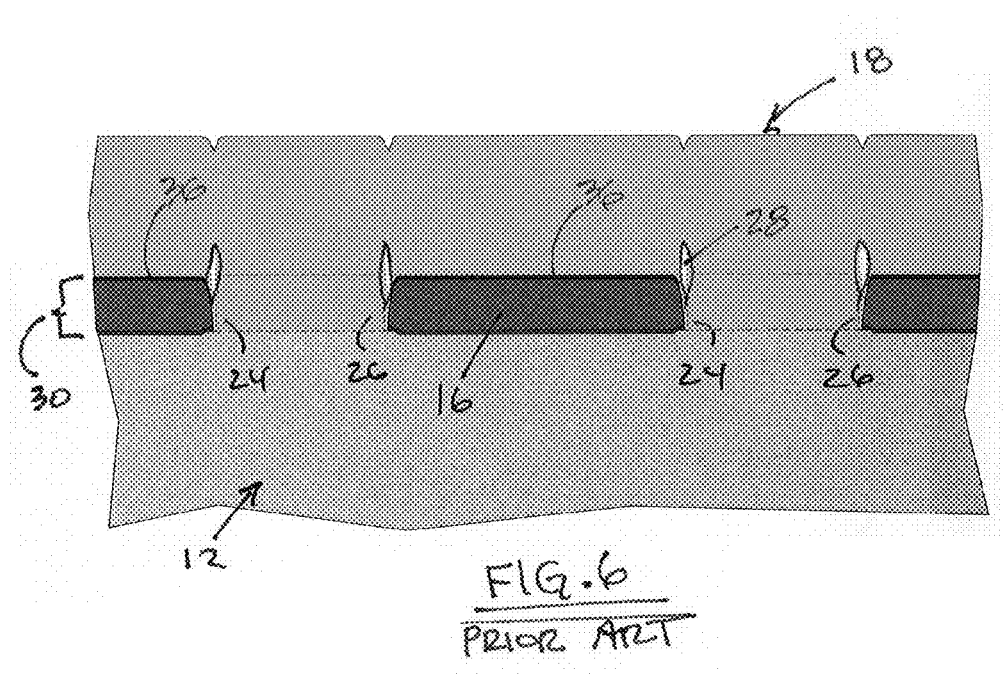
FIG. 6 is a diagrammatical illustration of a buried interdigital acoustic wave device known in the art to have undesirable voids inaccessible for a practical removal thereof.
Figure 5:
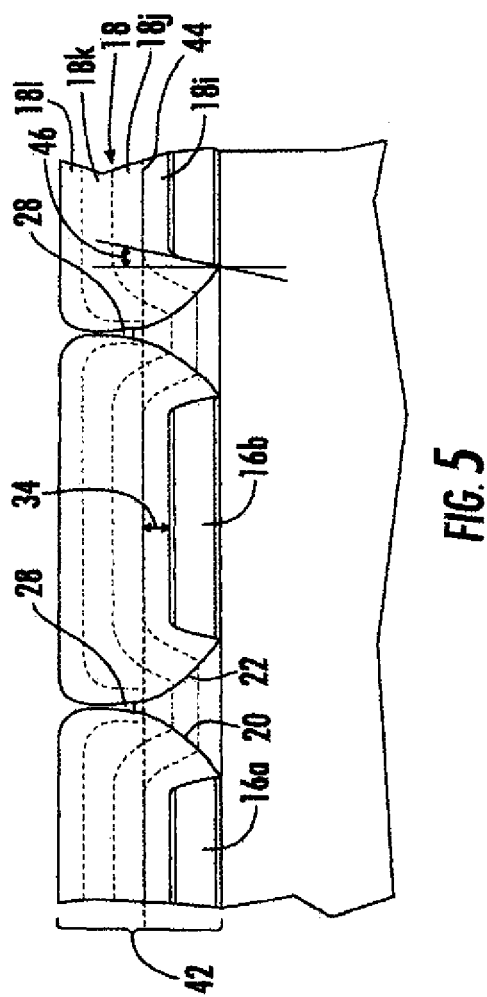
FIG. 5 is a diagrammatical illustration of a buried interdigital acoustic wave device in a preliminary stage of fabrication and prior to removal of undesirable voids from a dielectric layer covering electrodes.
Figure 6:
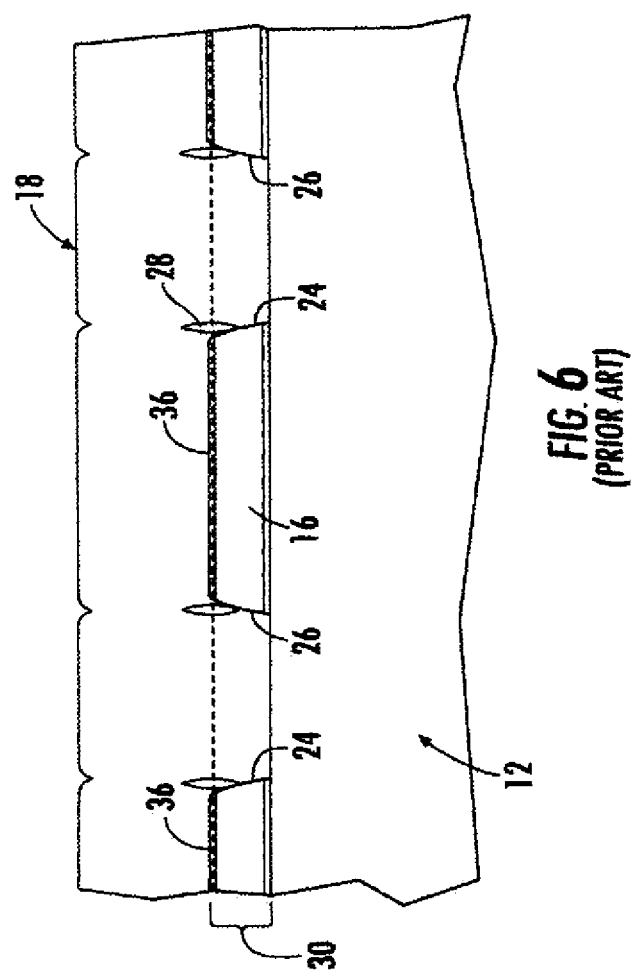
Figure 7A:
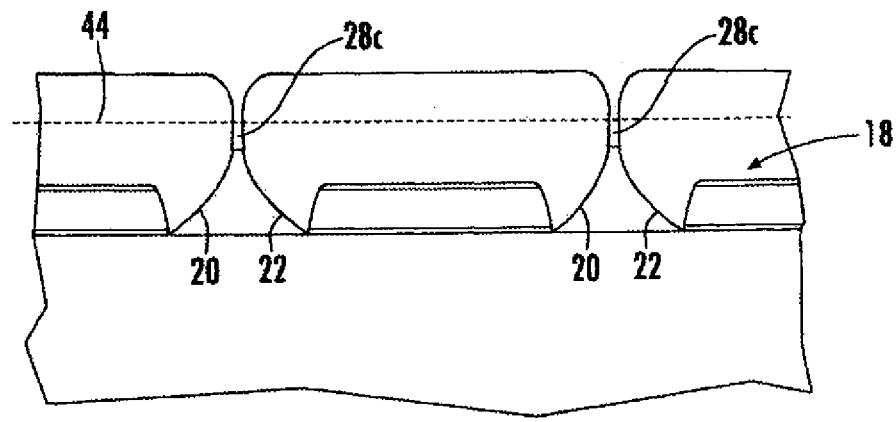
Figure 7B:
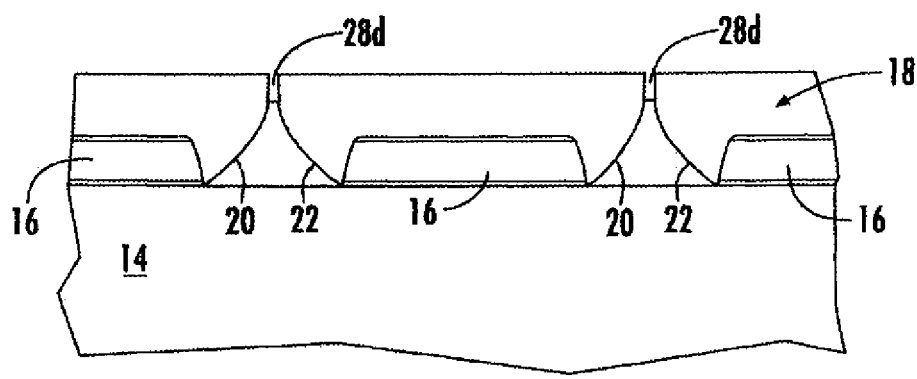
Figure 7C:
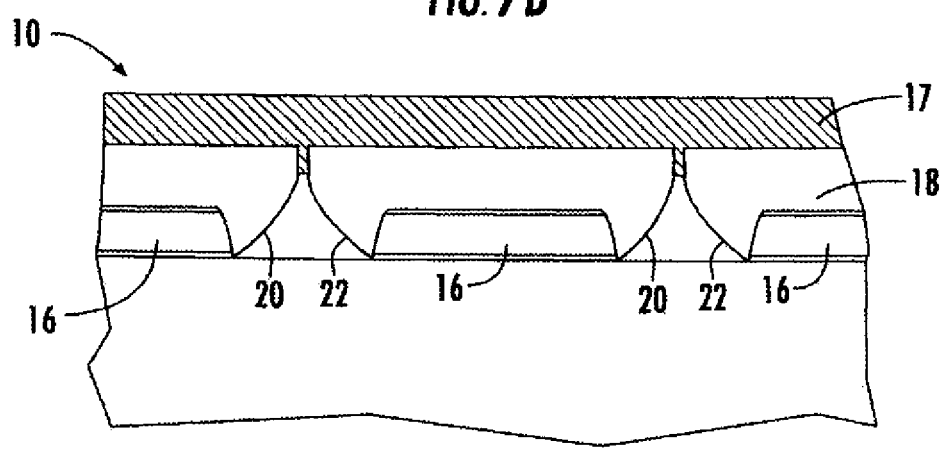
Figure 8A:
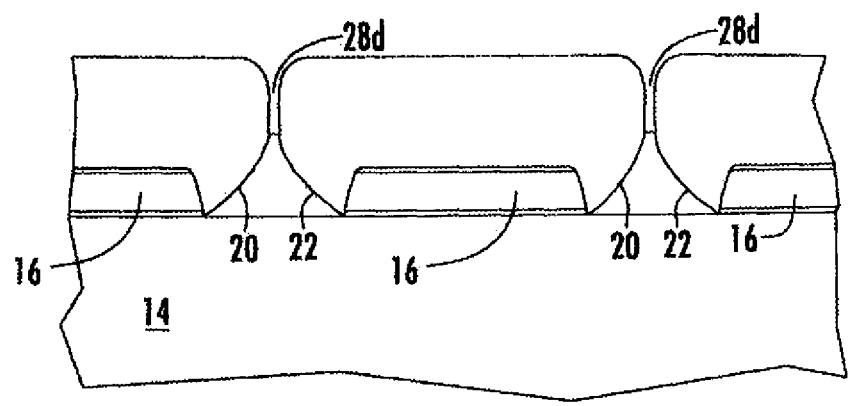
Figure 8B:
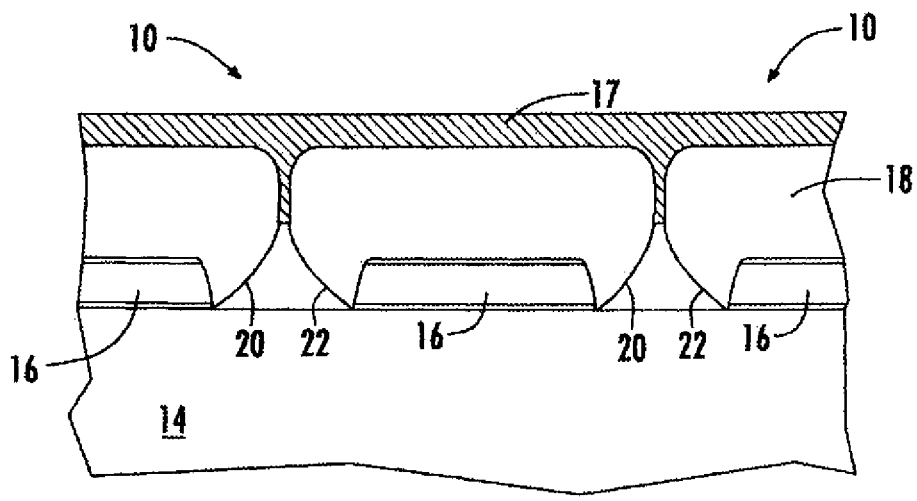

With continued reference to FIG. 5, the dielectric layer 18 may be formed by applying multiple thinner layers, as illustrated via layers 18i, 18j, 18k, and 18l. Whether formed as the single layer 18b earlier described with reference to FIG. 2, or by applying multiple thin layers, the first and second seams 20, 22 and the void 28 result as above described. Yet further, the undesirable void 28 may be easily removed through planarization or the like, thus resulting in a buried IDT device having desirable performance characteristics. As above described in the Background section of this specification, it has been observed that the oxide layers for well known devices such as the device described in Nishiyama result in the voids 28 in the vicinity of the electrode edges 24 26. These voids, as above described and as illustrated by way of example with reference to FIG. 6, are portions or traces in the oxide that exhibit undesirable lower density material when compared to the overall layer. Further, these voids 28 can significantly degrade the quality factor of the resonator. Unlike the voids 28 resulting in device typically known in the art, which voids cannot be practically or effective removed, the present invention provides devices and methods for the deposition of the oxide layer 18 without the voids 28 remaining in the produced device 10, thus providing an improved insertion loss and quality factor of a resonator, by way of example.

With reference again to FIG. 5, it has been found that the shape of the electrode 16 will affect the exact shape and density of the seams 20, 22 and the void 28. By way of example, while an electrode may be though of as having an rectangular cross section, but likely has a somewhat trapezoidal cross section, thus including a positive angle 46 rather that its edge being exactly perpendicular to the surface 14. In addition, the positions of the seams 20, 22 and exact location and shape of the voids 28 will generally be affected by the spacing 48 or pitch of the electrodes 16.

Figure 7A:
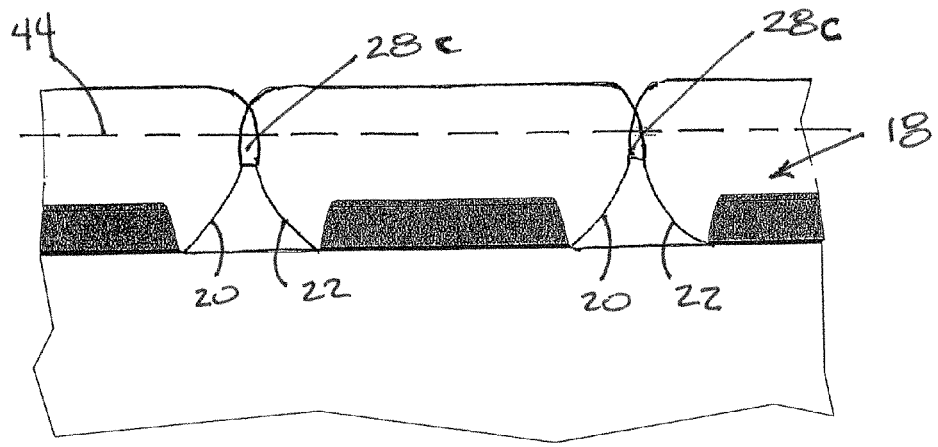
FIGS. 7a-7c are diagrammatical illustrations of one process for forming and removing undesirable voids with a dielectric layer covering a substrate and electrodes.
Figure 7B:
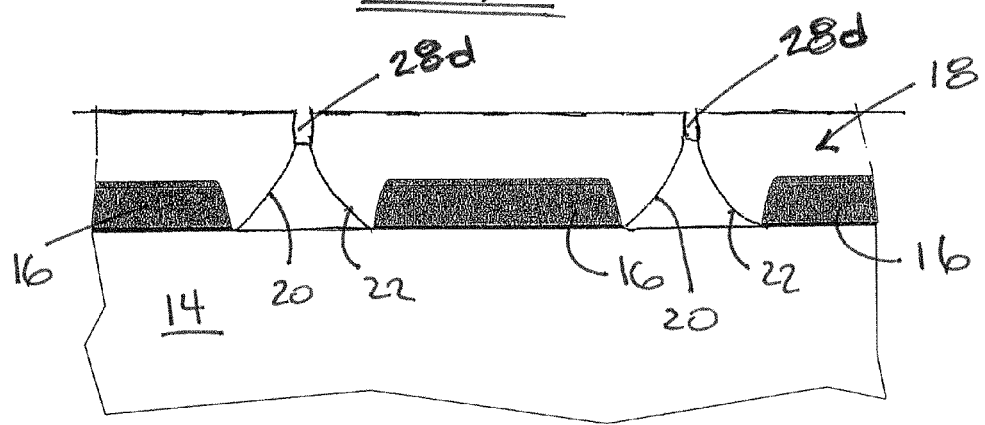
Figure 7C:
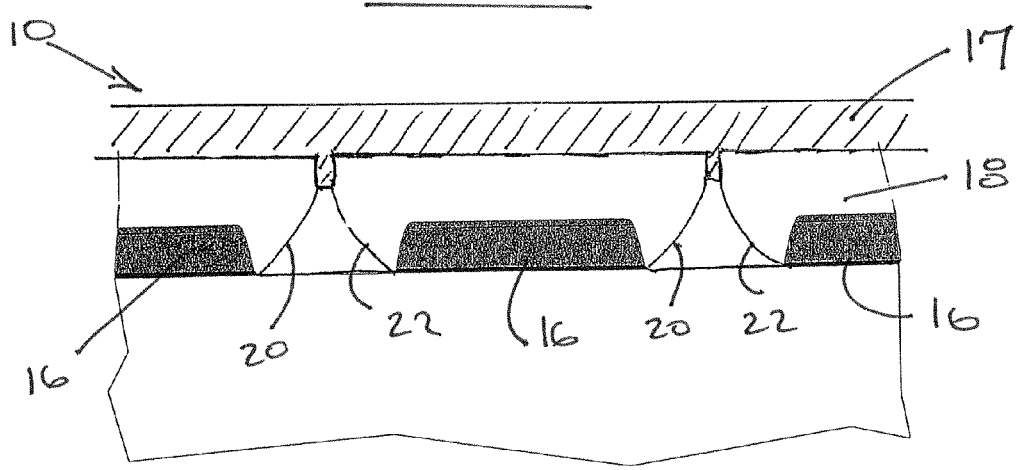

With reference now to FIGS. 7a-7c, the seams 20, 22 may join as above described to form a generally closed void 28c preferably requiring that the dielectric layer 18 be planarized, as earlier described along a line of planarization 44 with reference to FIGS. 1-3, and herein illustrated with reference to FIG. 7a. Following planarization sufficient to allow a generally open access void 28d, illustrated with reference to FIG. 7b, the device 10 may then receive more of the dielectric material forming the layer 18 or optionally another dielectric material for forming another layer 17 that permits the open voids 28d to be filled.

Figure 8A:
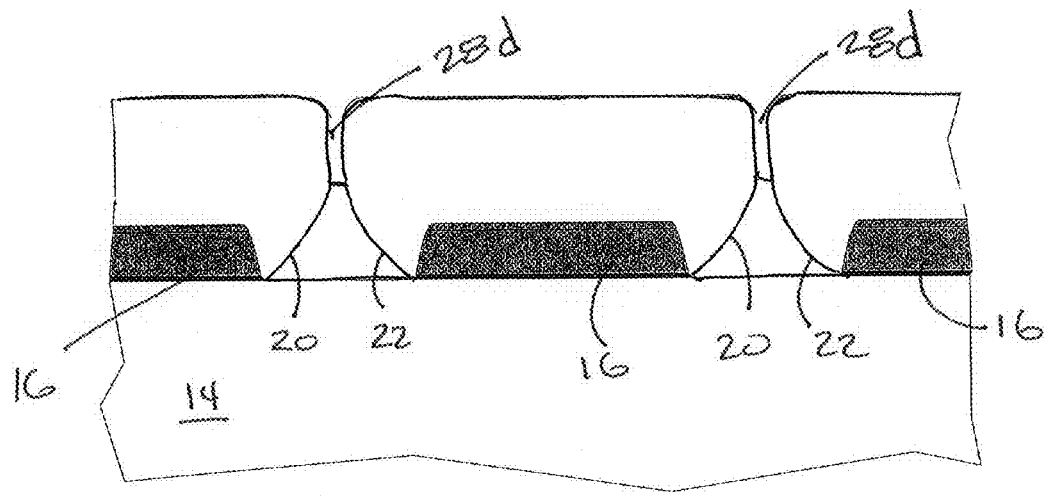
FIGS. 8a and 8b are diagrammatical illustrations of yet another process for forming and removing undesirable voids with a dielectric layer covering a substrate and electrodes.
Figure 8B:
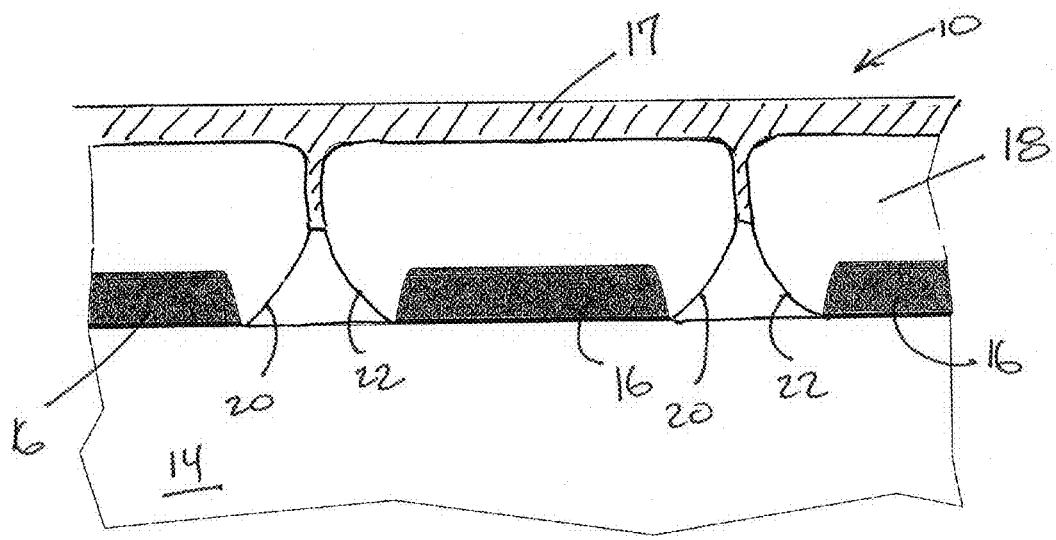
Figure 1:
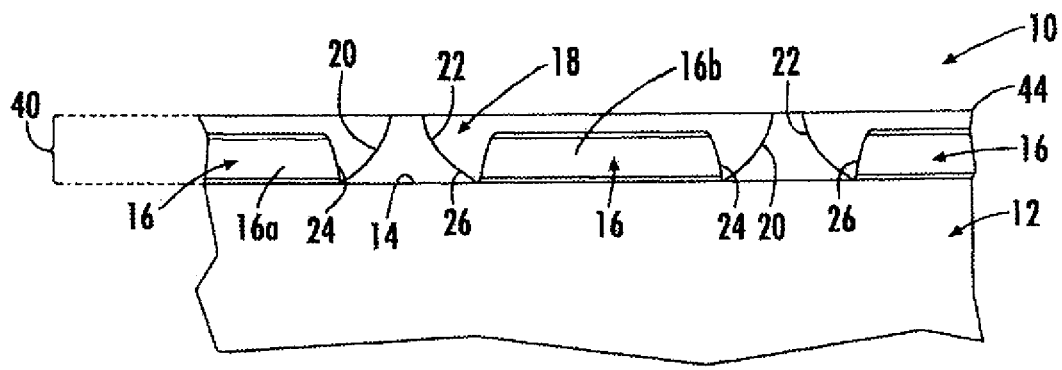
Figure 2:
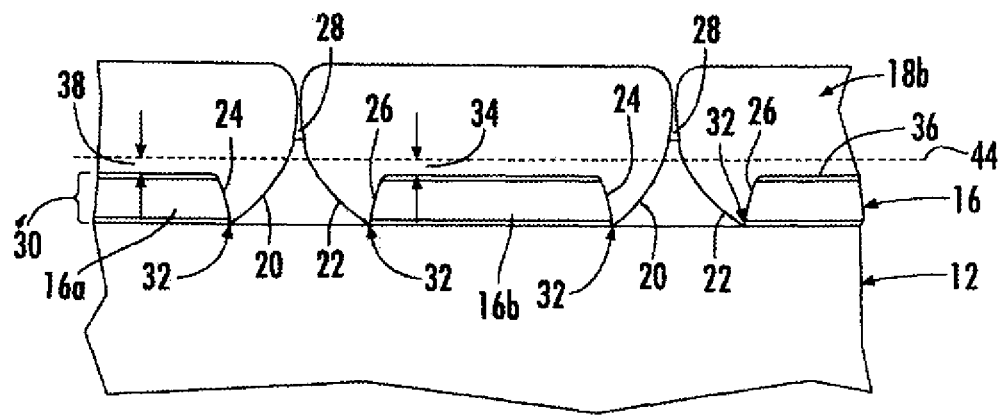
Figure 3:
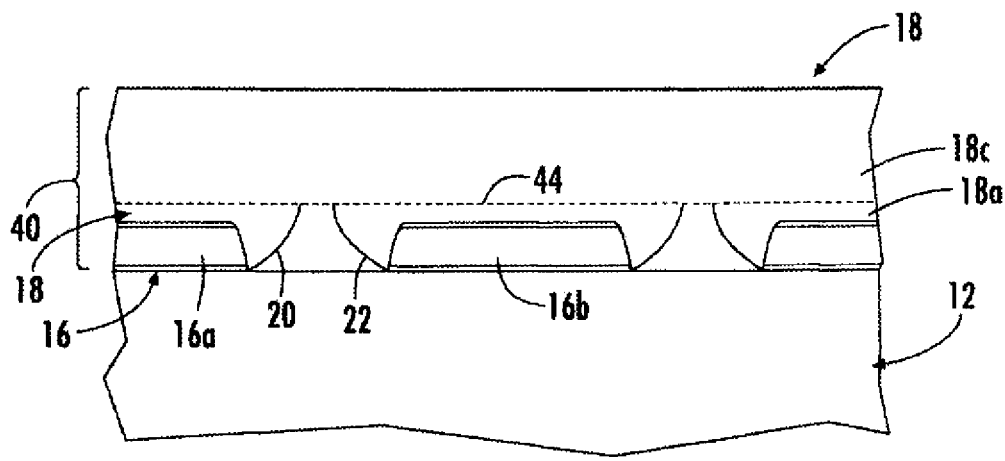
Figure 4:
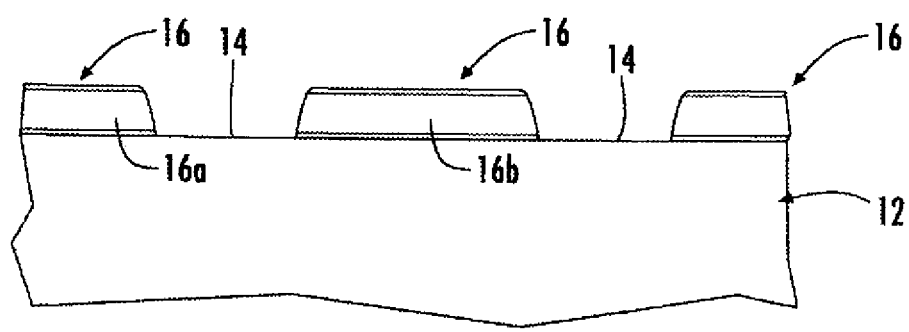

With reference now to FIGS. 8a and 8b, the seams 20, 22 may join as above described to directly form the generally open void 28d thus optionally allowing more of the dielectric material forming the layer 18 or another dielectric material for forming the other layer 17 that permits the open voids 28d to be filled.

It will thus come to the mind of those skilled in the art, now having the benefit of the teachings of the present invention, that the removal of the third seam or void may be a result of a planarization to the dielectric layer to fully remove the third seam, a planarization to the dielectric layer to a distance above the electrodes sufficient to partially remove the third seam followed by a filling of the third seam with at least one of a dielectric material forming the dielectric layer and a second dielectric material, and combinations thereof. Regardless of such structures, the teachings of the above described invention provide the device 10 with an improved insertion loss and quality factor.

Many modifications and other embodiments of the invention will come to the mind of one skilled in the art having the benefit of the teachings presented in the foregoing descriptions and associated drawings. Therefore, it is understood that the invention is not to be limited to the specific embodiments disclosed, and that modifications and embodiments are intended to be included within the scope of the appended claims.

That which is claimed is:

1. A method of fabricating SAW device, the method comprising:
    providing a piezoelectric substrate;
    placing a plurality of metal electrodes onto a surface of the piezoelectric substrate;
    depositing a dielectric layer onto the surface of the piezoelectric substrate sufficient to cover the electrodes, wherein the depositing forms seams extending upward from the electrodes, and wherein one seam extending from one electrode joins a second seam extending from an adjacent electrode to form a third seam within the dielectric layer and generally above the electrodes; and
    substantially removing the third seam from the dielectric layer.

2. The method according to claim 1, wherein the third seam substantially removing comprises applying a planarization to the dielectric layer to a distance above the electrodes sufficient to substantially remove the third seam.

3. The method according to claim 2, further comprising depositing a second layer, wherein the second layer depositing comprises a step occurring at least one of before and after the applying planarization step.

4. The method according to claim 1, wherein the third seam substantially removing comprises filling the third seam with at least one of a dielectric material forming the dielectric layer and filling the third seam with a second dielectric material.

5. The method according to claim 4, further comprising depositing a second layer, wherein the second layer depositing comprises a step occurring at least one of before and after the applying planarization step, and wherein the second layer depositing step provides the third seam filling.

6. The method according to claim 5, wherein the dielectric layer comprises a first dielectric layer, and wherein the second layer depositing comprises depositing a second dielectric layer.

7. The method according to claim 6, further comprising planarizing the second dielectric layer for providing at least one of a flatness to a surface thereof and a resulting overcoat formed over the substrate and electrodes.

8. The method according to claim 1, wherein the third seam substantially removing step comprises:

applying a planarization to the dielectric layer to a distance above the electrodes sufficient to at least partially remove the third seam; and
    filling the third seam with at least one of a dielectric material forming the dielectric layer and filling the third seam with a second dielectric material.

9. The method according to claim 1, wherein the seam forming comprises forming a region within the dielectric layer having a density generally less than a density extend substantially throughout the dielectric layer, and wherein the third seam comprises an amount of dielectric ranging from a void having no dielectric to a dielectric material having a density less than the density of dielectric in the first and second seams.

10. The method according to claim 1, wherein the dielectric layer depositing comprises depositing an oxide layer.

11. The method according to claim 1, wherein the dielectric layer depositing comprises depositing multiple dielectric layers.

12. A SAW device comprising:
    a piezoelectric substrate having a surface thereon;
    a plurality of metal electrodes on the surface of the piezoelectric substrate; and
    a dielectric layer on the surface of the piezoelectric substrate resulting from depositing the dielectric layer sufficient to cover the metal electrodes,
    wherein the depositing forms seams extending upward from electrodes,
    and wherein a third seam resulting from one seam extending from one electrode joining a second seam extending from an adjacent electrode within the dielectric layer and generally above the electrodes is substantially removed from the dielectric layer.

13. The SAW device according to claim 12, the third seam removal results from at least one of a planarization to the dielectric layer to a distance above the electrodes sufficient to fully remove the third seam, a planarization to the dielectric layer to a distance above the electrodes sufficient to at least partially remove the third seam, filling the third seam with at least one of a dielectric material forming the dielectric layer and a second dielectric material, and a combination thereof.

14. The SAW device according to claim 12, wherein the first, second and third seam comprise regions within the dielectric layer having a density generally less than a density extending substantially throughout the dielectric layer, and wherein the third seam comprises a density ranging from no dielectric to a dielectric having a density less than the density of dielectric in the first and second seams prior to the removal of the third seam.

15. The SAW device according to claim 12, wherein the dielectric layer comprises first and second dielectric layers.

16. The SAW device according to claim 15, wherein the second dielectric layer is deposited onto the first dielectric layer, and wherein the second layer is planarized for providing at least one of a flatness to a surface thereof and a resulting thickness of an overcoat formed over the substrate and the electrodes.

17. The SAW device according to claim 12, wherein the dielectric layer comprises an oxide layer.

18. An acoustic wave device comprising:
    a piezoelectric substrate having a surface thereon;
    a plurality of metal electrodes on the surface of the piezoelectric substrate; and
    a dielectric layer on the surface of the piezoelectric substrate resulting from depositing the dielectric layer onto the substrate sufficient to cover the metal electrodes, wherein the depositing forms seams extending upward from the electrodes extending above the surface of the substrate.

19. The acoustic wave device according to claim 18, wherein a third seam resulting from one seam extending from one electrode joining a second seam extending from an adjacent electrode within the dielectric layer and generally above the electrodes is sufficiently removed from the dielectric layer.

20. The SAW device according to claim 19, wherein the third seam removal results from at least one of a planarization to the dielectric layer to a distance above the electrodes sufficient to partially remove the third seam, a planarization to the dielectric layer to a distance above the electrodes sufficient to fully remove the third seam, filling the third seam with at least one of a dielectric material forming the dielectric layer and a second dielectric material, and a combination thereof.

21. The acoustic wave device according to claim 18, wherein the dielectric layer is planarized sufficiently for providing a thickness of the dielectric layer extending above a the substrate and the electrodes.

22. The acoustic wave device according to claim 18, wherein the dielectric layer comprises at least one oxide layer.

23. The acoustic wave device according to claim 18, wherein the dielectric layer on the surface of the piezoelectric substrate and above the electrodes results from depositing a plurality of dielectric layers.

* * * * *

UNITED STATES PATENT AND TRADEMARK OFFICE
CERTIFICATE OF CORRECTION

| | | |
|---|---|---|
| PATENT NO. | : 8,044,553 B2 | |
| APPLICATION NO. | : 12/709772 | |
| DATED | : October 25, 2011 | |
| INVENTOR(S) | : Alen S. Chen et al. | |

It is certified that error appears in the above-identified patent and that said Letters Patent is hereby corrected as shown below:

Title page, illustrative fig. 8B should be deleted and substitute therefore the attached title page consisting of illustrative fig. 8B.

In the Drawings

The drawing sheets 1-6 consisting of Fig(s) 1-8B should be deleted and substitute therefore the attached drawing sheets 1-6 consisting of Fig(s) 1-8B.

Signed and Sealed this
Tenth Day of April, 2012

David J. Kappos
*Director of the United States Patent and Trademark Office*

United States Patent
Chen et al.

(10) Patent No.: US 8,044,553 B2
(45) Date of Patent: Oct. 25, 2011

(54) TEMPERATURE COMPENSATED SURFACE ACOUSTIC WAVE DEVICE AND METHOD HAVING BURIED INTERDIGITAL TRANSDUCERS FOR PROVIDING AN IMPROVED INSERTION LOSS AND QUALITY FACTOR

(75) Inventors: Alan S. Chen, Windermere, FL (US); Taeho Kook, Orlando, FL (US); Kurt G. Steiner, Orlando, FL (US); Stephen A. Neston, Orlando, FL (US); Timothy J. Daniel, Orlando, FL (US)

(73) Assignee: Triquint Semiconductor, Inc., Orlando, FL (US)

( * ) Notice: Subject to any disclaimer, the term of this patent is extended or adjusted under 35 U.S.C. 154(b) by 81 days.

(21) Appl. No.: 12/709,772

(22) Filed: Feb. 22, 2010

(65) Prior Publication Data
US 2011/0204747 A1    Aug. 25, 2011

(51) Int. Cl.
*H03H 9/25*    (2006.01)
*H01L 41/22*    (2006.01)

(52) U.S. Cl. .............. 310/313 R; 310/340; 29/25.35

(58) Field of Classification Search ... 310/313 A–313 D, 310/313 R, 340; 29/25.35
See application file for complete search history.

(56) References Cited

U.S. PATENT DOCUMENTS

| 6,864,424 | B2* | 3/2005 | Mishima et al. ............ 174/549 |
|---|---|---|---|
| 7,209,018 | B2 | 4/2007 | Nakao et al. |
| 7,224,101 | B2 | 5/2007 | Mishima et al. |
| 7,230,365 | B2 | 6/2007 | Nishiyama et al. |
| 2006/0273687 | A1* | 12/2006 | Fujimoto et al. ......... 310/313 R |
| 2008/0182367 | A1 | 7/2008 | Petti |
| 2009/0265904 | A1 | 10/2009 | Kando et al. |
| 2009/0280584 | A1 | 11/2009 | Parekh |
| 2010/0033055 | A1* | 2/2010 | Nakatani ............... 310/313 R |

FOREIGN PATENT DOCUMENTS

| JP | 200580202 | 3/2005 |
|---|---|---|
| JP | 2005150915 | 6/2005 |
| WO | 2004070946 | 8/2004 |
| WO | 2006114930 | 11/2006 |
| WO | 2008087836 | 7/2008 |

\* cited by examiner

*Primary Examiner* — Thomas M Dougherty
(74) *Attorney, Agent, or Firm* — Allen, Dyer, Doppelt, Milbrath & Gilchrist, P.A.

(57) ABSTRACT

A SAW device having metal electrodes on a surface of the piezoelectric substrate includes a dielectric layer deposited on the surface. Depositing the layer results in seams extending upward from the electrodes extending above the surface of the substrate. An additional seam results from one seam extending from one electrode joining a second seam extending from an adjacent electrode within the dielectric layer and is generally formed above the height of the electrodes. The additional seam is removed through planarization or the like. The dielectric layer may be further planarized for providing a thickness of the dielectric layer above the electrodes as desired.

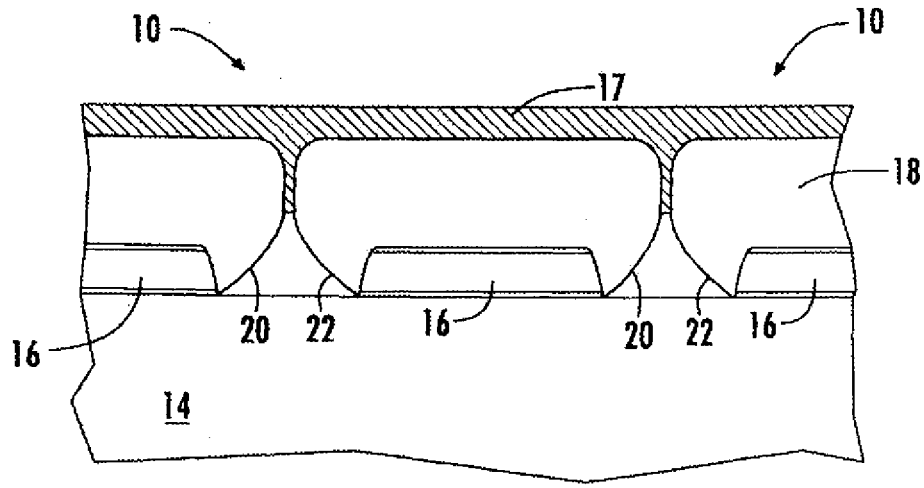

23 Claims, 6 Drawing Sheets